United States Patent
Smith

(10) Patent No.: US 7,075,309 B2
(45) Date of Patent: Jul. 11, 2006

(54) SYSTEM AND METHOD TO LOCATE AN ANOMALY OF A CONDUCTOR

(75) Inventor: Paul Samuel Smith, West Valley City, UT (US)

(73) Assignee: Livewire Test Labs, Inc., Salt Lake City, UT (US)

(*) Notice: Subject to any disclaimer, the term of this patent is extended or adjusted under 35 U.S.C. 154(b) by 0 days.

(21) Appl. No.: 10/906,786

(22) Filed: Mar. 7, 2005

(65) Prior Publication Data
US 2005/0194978 A1    Sep. 8, 2005

Related U.S. Application Data

(60) Provisional application No. 60/521,192, filed on Mar. 8, 2004.

(51) Int. Cl.
*G01R 31/08* (2006.01)

(52) U.S. Cl. .................... 324/535; 324/534

(58) Field of Classification Search ............ 324/534, 324/535
See application file for complete search history.

(56) References Cited

U.S. PATENT DOCUMENTS

| | | | |
|---|---|---|---|
| 4,110,572 A | 8/1978 | Cochrane | 324/532 |
| 4,538,103 A | 8/1985 | Cappon | 324/534 |
| 4,970,466 A | 11/1990 | Bolles et al. | 324/533 |
| 5,352,984 A | 10/1994 | Piesinger | 324/532 |
| 5,369,366 A | 11/1994 | Piesinger | 324/533 |
| 5,479,610 A | 12/1995 | Roll-Mecak et al. | 714/25 |
| 5,586,054 A | 12/1996 | Jansen et al. | 324/533 |
| 5,608,328 A | 3/1997 | Sanderson | 324/529 |
| 5,714,885 A | 2/1998 | Lulham | 324/529 |
| 5,751,149 A | 5/1998 | Oberg et al. | 324/533 |
| 5,867,030 A | 2/1999 | Sato | 324/617 |
| 5,949,236 A | 9/1999 | Franchville | 324/533 |
| 5,990,687 A | 11/1999 | Williams | 324/529 |
| 6,037,780 A | 3/2000 | Ohtaki | 324/535 |
| 6,097,755 A | 8/2000 | Guenther, Jr. et al. | 375/228 |
| 6,104,197 A | 8/2000 | Kochan | 324/533 |
| 6,144,721 A | 11/2000 | Stephens | 379/21 |
| 6,215,314 B1 | 4/2001 | Frankewich, Jr. | 329/529 |
| 6,285,195 B1 | 9/2001 | Needle | 324/534 |
| 6,448,781 B1 | 9/2002 | Frank et al. | 324/533 |
| 6,472,883 B1 * | 10/2002 | Burnett | 324/534 |
| 6,509,740 B1 | 1/2003 | Needle et al. | 324/533 |
| 6,516,053 B1 | 2/2003 | Ryan et al. | 324/533 |

(Continued)

*Primary Examiner*—Walter Benson
(74) *Attorney, Agent, or Firm*—Meschkow & Gresham, P.L.C.

(57) ABSTRACT

A system (20) and method to locate an anomaly (22) of a conductor (24) is provided. The system (20) uses a test set (28) to inject a test signal (36) into the conductor (24) at a location ($P_T$) and a probe (30) to detect the test signal (36) at a second location ($P_P$). A communication link (42) between the probe (30) and the test set (28) has a predetermined propagation delay ($D_S$), from which the system (20) can calculate a propagation delay ($D_{TP}$) of the conductor (24) between the test set (28) and the probe (30), and a propagation delay ($D_{PA}$) between the probe (30) and the anomaly (22). By varying the location ($P_P$) of the probe (30) until the propagation delay ($D_{PA}$) between the probe (30) and the anomaly (22) is substantially zero, the precise location ($P_A$) of the anomaly (22) may be determined. The propagation velocity ($V_C$) of the conductor (24) may also be determined. The physical distance ($L_{PA}$) between the probe (30) and the anomaly (22), and hence the precise location ($P_A$) of the anomaly (22), again may be determined.

24 Claims, 3 Drawing Sheets

U.S. PATENT DOCUMENTS

| | | | |
|---|---|---|---|
| 6,531,880 B1 | 3/2003 | Schneider et al. | 324/539 |
| 6,532,839 B1 | 3/2003 | Kluth et al. | 73/866.5 |
| 6,538,451 B1 | 3/2003 | Galli et al. | 375/222 |
| 6,653,848 B1 | 11/2003 | Adamian et al. | 324/638 |
| 6,687,289 B1 | 2/2004 | Bohley | 375/224 |
| 6,690,320 B1 | 2/2004 | Benway et al. | 342/124 |
| 6,691,051 B1 | 2/2004 | Willmann | 702/76 |
| 6,714,021 B1 | 3/2004 | Williams | 324/533 |
| 6,763,108 B1 | 7/2004 | Stephens | 379/399.01 |
| 6,798,211 B1 | 9/2004 | Rockwell et al. | 324/527 |
| 6,798,212 B1 | 9/2004 | Stierman et al. | 324/534 |
| 6,820,255 B1 | 11/2004 | Babaian et al. | 717/151 |
| 6,822,457 B1 * | 11/2004 | Borchert et al. | 324/512 |
| 6,826,506 B1 | 11/2004 | Adamian et al. | 702/118 |
| 6,842,011 B1 | 1/2005 | Page et al. | 324/637 |
| 6,847,213 B1 | 1/2005 | Renken et al. | 324/628 |
| 6,856,138 B1 | 2/2005 | Bohley | 324/534 |
| 6,867,597 B1 * | 3/2005 | Hauptner et al. | 324/533 |

* cited by examiner

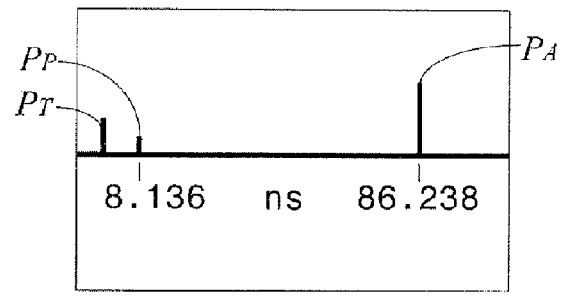
FIG. 5
FIG. 6
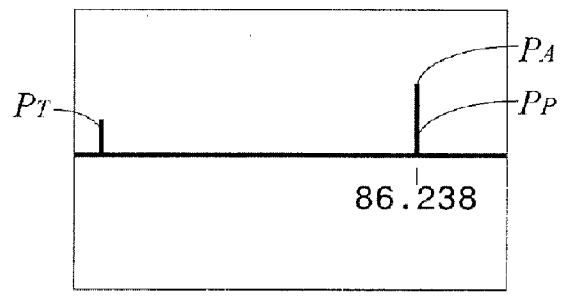
FIG. 7
FIG. 8
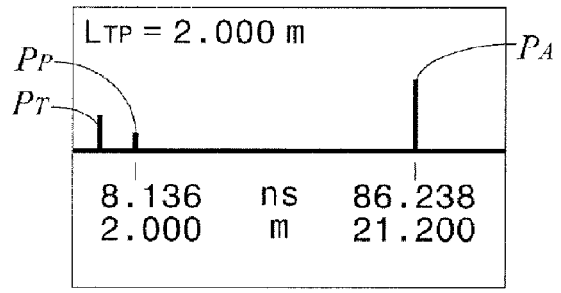
FIG. 9
FIG. 10
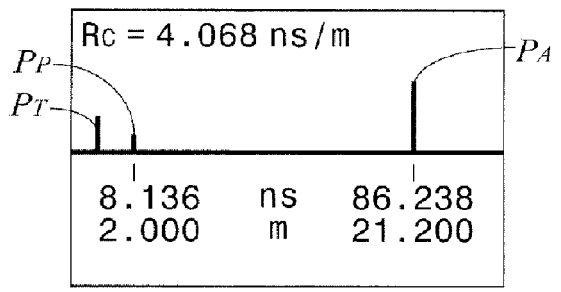
FIG. 11
FIG. 12

SYSTEM AND METHOD TO LOCATE AN ANOMALY OF A CONDUCTOR

RELATED INVENTION

The present invention claims benefit under 35 U.S.C. §119(e) to "Fast Wire Probe," U.S. Provisional Patent Application Ser. No. 60/521,192, filed 8 Mar. 2004, which is incorporated by reference herein.

TECHNICAL FIELD OF THE INVENTION

The present invention relates to the field of conductor test equipment. More specifically, the present invention relates to the field of reflectometric test equipment used to locate the position of an anomaly of a conductor.

BACKGROUND OF THE INVENTION

An installed conductor may be buried, embedded in an airframe, enclosed within walls, or otherwise removed from direct access. The testing and evaluation of an installed conductor will often present a problem. For example, the location and path of the conductor may not be obvious to an inspector. This may make the use of time domain reflectometry (TDR), standing wave reflectometry (SWR), and other reflectometric inspection methods difficult to use effectively by rendering the inspector unable to accurately correlate information presented by the test equipment to the conductor itself.

Signal generators and similar devices may be used to inject a signal into the conductor. This signal then radiates from the conductor, and may be traced by a "sniffer." A sniffer is a device that detects the radiated signal and, based on the detection of a signal, indicates by lights, a meter, a tone, and/or other means its proximity to the conductor. An inspector may then trace the path of the conductor using the sniffer.

Certain types of anomalies may be detected through the use of a sniffer alone. For example, the tone may abruptly cease when the sniffer reaches an open or a short (for certain types of signal generators and sniffers) in the conductor. Signal generators and sniffers do not, however, normally convey data about other types of anomalies, nor do they present information as to the electrical distance the sniffer has traversed, where electrical distance is the propagation delay, i.e., the time the signal has taken to traverse the conductor from a point of injection (where the signal generator injects the signal) to a point of detection (where the sniffer is).

Signals travel down a conductor at a propagation velocity $V_C$, measured in "distance/time". The propagation velocity $V_C$ of a conductor is in all cases less than the velocity of light in a vacuum, c, and usually not less than one-half the that value, i.e.: $0.5c \leq V_C < C$. The propagation velocity $V_C$ of a particular conductor is a peculiarity of that conductor, although certain "standardized" conductors (e.g., RG-6/U coaxial cable) have known and predictable propagation velocities $V_C$.

The propagation velocity $V_C$ of a conductor may be used to convert a propagation delay $D_{XY}$, (i.e., the electrical distance, or the time the signal has taken to traverse the conductor from a point X to a point y) into a physical length $L_{XY}$ of the conductor between points X and Y in a direct and straightforward manner: $L_{XY} = D_{XY}/V_C$.

Therefore, using a suitable test apparatus (e.g., a reflectometer) able to determine propagation delay $D_{XY}$ from a reference point X (e.g., a signal injection point) to an anomaly at a point Y of the conductor, the physical distance $L_{XY}$ from that reference point to an anomaly of a conductor may readily be determined if the propagation velocity $V_C$ of the conductor is known. The accuracy of the result depends directly upon the accuracy with which the propagation velocity $V_C$ is known.

In many cases, the propagation delay $D_{XY}$ may be determined accurately, but the propagation velocity is not known. Determining the physical distance $L_{XY}$ cannot then be done without first determining the propagation velocity $V_C$. Without knowing the physical length $L_{XY}$, an inspector has no direct way of knowing the location of the anomaly, Y, relative to the point of injection, X.

Determination of the propagation velocity $V_C$ depends upon the nature of the conductor being inspected, its routing, and the nature of the environment in which the conductor is embedded.

SUMMARY OF THE INVENTION

Accordingly, it is an advantage of the present invention that a system and method to locate an anomaly of a conductor is provided.

It is another advantage of the present invention that a system and method are provided to determine a physical distance from a point of signal injection to a point of signal detection of a conductor.

It is another advantage of the present invention that a system and method are provided to determine a physical distance from a point of signal injection to an anomaly of a conductor.

It is another advantage of the present invention that a system and method are provided to determine a propagation delay between a point of signal injection and an anomaly of a conductor.

It is another advantage of the present invention that a system and method are provided to determine a propagation velocity of a conductor.

The above and other advantages of the present invention are carried out in one form by a system to locate an anomaly of a conductor. The system includes a test set coupled to the conductor at a first location along the conductor and configured to inject a test signal into the conductor at the first location, a probe coupled to the conductor at a second location and configured to detect the test signal at the second location, a communication link configured to couple the probe to the test set and having a first propagation delay, and a calculation unit coupled to the probe and/or the test set and configured to calculate a second propagation delay of the conductor from the first location to the second location in response to the first propagation delay.

The above and other advantages of the present invention are carried out in one form by a method to locate an anomaly of a conductor. The method includes establishing a communication link between a probe and a test set, determining a first propagation delay between the probe and the test set over the communication link, injecting a test signal at a first location along the conductor using the test set, detecting the test signal at a second location along the conductor using the probe, and calculating a second propagation delay between the first location and the second location in response to the first propagation delay.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 5 shows an alphanumeric output unit for the system of FIG. 1 in accordance with a preferred embodiment of the present invention;

FIG. 6 shows a graphical output unit for the system of FIG. 1 in accordance with a preferred embodiment of the present invention;

FIG. 7 shows the alphanumeric output unit of FIG. 5 when the probe is over the anomaly in accordance with a preferred embodiment of the present invention;

FIG. 8 shows the graphical output unit of FIG. 6 when the probe is over the anomaly in accordance with a preferred embodiment of the present invention;

FIG. 9 shows the alphanumeric output unit of FIG. 5 demonstrating a physical distance to an anomaly when a physical distance between the test set and the probe is known in accordance with a preferred embodiment of the present invention;

FIG. 10 shows the graphical output unit of FIG. 6 demonstrating a physical distance to an anomaly when a physical distance between the test set and the probe is known in accordance with a preferred embodiment of the present invention;

FIG. 11 shows the alphanumeric output unit of FIG. 5 demonstrating a physical distance to an anomaly when a propagation velocity of the conductor is known in accordance with a preferred embodiment of the present invention; and FIG. 12 shows the graphical output unit of FIG. 6 demonstrating a physical distance to an anomaly when a propagation velocity of the conductor is known in accordance with a preferred embodiment of the present invention.

DETAILED DESCRIPTION OF THE PREFERRED EMBODIMENTS

Figure 1:
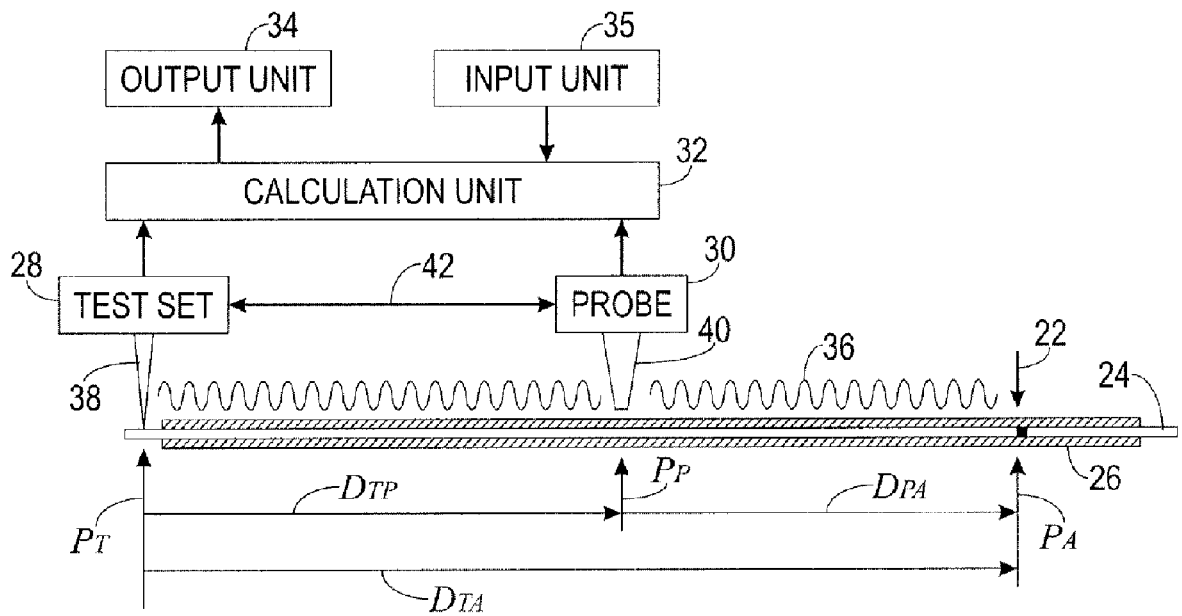
FIG. 1 shows a schematic view of an anomaly detection system in accordance with a preferred embodiment of the present invention.

FIG. 1 shows a schematic view of a system 20 for the detection and location of an anomaly 22 of a conductor 24 in accordance with a preferred embodiment of the present invention. The following discussion refers to FIG. 1.

Those skilled in the art will appreciate that, throughout this discussion, the term "conductor" refers to one or more wires, cables, tubes, pipes, or other conductive media having an impedance, whether or not that impedance is known or can be determined. Similarly, the term "anomaly" refers to one or more terminations, shorts, opens, bends, kinks, splices, junctions, shield tears, faults, or other artifacts producing a change in an impedance of a conductor.

Conductor 24 is the conductor under test, and is often inaccessible in the direct sense. That is, conductor 24 may be buried, enclosed within an airframe or a wall, within a raceway, within a cable or bundle of other conductors, or otherwise inaccessible to direct contact throughout the majority of its length.

For the sake of simplicity, conductor 24 is depicted in the Figures as a wire (as one of a possible wire pair or the central conductor of a coaxial cable) covered with insulation 26 except at its endpoints. This depiction is exemplary only, and should not be construed as placing any limitation upon conductor 24 as defined hereinbefore.

Similarly, anomaly 22 is depicted in the Figures as a break in conductor 24 at an undetermined location $P_A$ of conductor 24. Again, this depiction is exemplary only and should not be construed as placing any limitation upon anomaly 22 as defined hereinbefore.

Anomaly detection system 20 is a reflectometric test apparatus made up of a test set 28, a probe 30, a calculation unit 32, and a output unit 34, and an input unit 35.

Test set 28 is a reflectometric transmission/reception unit capable of transmitting a test signal 36 and receiving an echo of test signal 36. Test set 28 is electrically coupled to conductor 24 at an injection location $P_T$ along conductor 24. Test set 28 is configured to inject test signal 36 into or onto conductor 24 at location $P_T$. Test signal 36 may be any of a plurality of signal types suitable for reflectometry, including, but not limited to, a time-domain reflectometry pulse, a digital sequence, a spread-spectrum signal, or a sequence of one or more sine waves.

Test set 28 is electrically coupled to conductor 24 by an injector 38. In the preferred embodiment, injector 38 may effect a direct connection to conductor 24 through a simple lead and alligator clip. Those skilled in the art will appreciate, however, that this is not a limitation of the present invention. While not shown in the Figures, it will be understood that injector 38 may be any device making either a direct or indirect connection with conductor 24. A direct connection may be made via a clip, clamp, lug, or sharp probe tip (as in the preferred embodiment). Indirect connection (not shown) may be made by radiative, capacitive, inductive, or other coupling not requiring direct contact with conductor 24.

Test signal 36 emits an evanescent electromagnetic field along the length conductor 24. When pickup 40 is within that evanescent field, probe 30 can detect an approximation of test signal 36 at location $P_P$ of pickup 40 along conductor 24. Test signal 36 as detected by probe 30 will be an approximation of test signal 36 as injected by test set 28.

Probe 30 is electrically coupled to conductor 24 at a detection location $P_P$ along conductor 24. Probe 30 is configured to detect test signal 36 from conductor 24 at location $P_P$. Probe 30 is electrically coupled to conductor 24 without physical contact by a pickup 40. In the preferred embodiment, pickup 40 does not effect a direct connection to conductor 24. Those skilled in the art will understand that pickup 40 may be any device making an indirect connection with conductor 24. Indirect connection (not shown) may be made by radiative, capacitive, inductive, or other coupling not requiring direct contact with conductor 24.

Probe 30 and pickup 40 are desirably designed to work in concert with test signal 36 as injected by test set 28. If test set 28 injects a time-domain reflectometry pulse, the pulse will be evident in test signal 36 as detected by probe 30, but with a delay equal to the time it took test signal 36 to travel along the length of conductor 24 from location $P_T$ to location $P_P$. This delay is the electrical distance between location $P_T$ and $P_P$. While test signal 36 emanates from the entire length of conductor 24, the evanescent tail from test signal 36 propagating through conductor 24 at location $P_P$ will tend to dominate.

If test set 28 uses standing-wave reflectometry, it may be more difficult to determine an electrical distance from test signal 36 as detected by probe 30. One method for determining electrical distance is to compare the relative amplitudes of the sensed frequencies of test signal 36 at probe 30. As standing-wave reflectometry generally senses the propagation delays to distance to anomalies by varying the frequency and looking for nulls (or dips in amplitude) at test set 28 for given frequencies. The relative amplitudes of the sensed frequencies detected by probe 30 can be correlated with test signal 36 as injected to estimate the distance of a null from probe 30. The frequencies of test signal 36 may be adjusted in many cases so as to sweep a null past probe 30 so that the electrical distance between locations $P_T$ and $P_P$ may be precisely determined. Similar analyses may be used for other frequency-swept reflective and transmissive methodologies (i.e., frequency domain reflectometry).

Spread-spectrum and sequence time-domain reflectometry depend on a correlation of reflected digital sequences to estimate propagation delay between injection location $P_T$ and anomaly location $P_A$. A known copy of test signal 36 may be correlated either with a raw received reflection of test signal 36, or a demodulated version of reflected test signal 36. Peaks in the correlation may be used to identify the electrical distance between locations $P_T$ and $P_P$.

The amplitude of test signal 36 as detected by probe 30 may vary. Since probe 30 is coupled to conductor 24 without physical contact, the attitude or orientation of probe 30 increases in importance. Desirably, probe 30 is adjusted in attitude or orientation until the detected test signal 36 is at a maximum amplitude. Calculation unit 32 (discussed hereinafter) may be used to calculate the amplitude(s) of test signal 36 prior to, during, and after the attitude of probe 30 is adjusted. Hence, calculation unit 32 may play a key part in the determination of the electrical distance (the delay of test signal 36) between locations $P_T$ and $P_P$. Output unit 34 (discussed hereinafter) may then be used to display and/or otherwise indicate (e.g., alphanumerically, graphically, and acoustically) the results obtained by calculation unit 32 in order to determine the proper attitude.

Multiple probes 30 may be used substantially simultaneously to identify multiple locations $P_P$ (and multiple electrical distances) along conductor 24. For clarity only one probe 30 is depicted in the Figures. Those skilled in the art will appreciate, however, that the use of only a single probe 30 is not a requirement of the present invention.

Calculation unit 32 is coupled to test set 28 and/or probe 30. Calculation unit 32 may be independent (e.g., a computer to which test set 28 and/or probe 30 is coupled), or may be integral to test set 28 and/or probe 30. Multiple calculation units 32 may be used, with each calculation unit 32 performing either all or part of the functions of calculation unit 32 as a whole. Those skilled in the art will appreciate that the location and/or implementation of calculation unit 32 is not germane to the present invention. The use of alternative embodiments of calculation unit 32 does not depart from the spirit of the present invention.

Calculation unit 32 performs calculations for system 20. The calculations performed by calculation unit 32 include, but are not limited to, the amplitude(s) of test signal 36, the electrical and physical distances between locations $P_T$, $P_P$, and $P_A$, and the propagation velocity and/or propagation rate of conductor 24.

Output unit 34 is coupled to calculation unit 32. Output unit 34 may be independent, or may be integral to calculation unit 32, test set 28, and/or probe 30. Multiple output units 34 may be used, with each output unit 34 performing either all or part of the functions of output unit 34 as a whole. Those skilled in the art will appreciate that the location and/or implementation of output unit 34 is not germane to the present invention. The use of alternative embodiments of output unit 34 does not depart from the spirit of the present invention.

Output unit 34 displays or otherwise indicates to a user the results an output of calculation unit 32. The display or indication of output unit 34 may include, but is not limited to, segmental, alphanumerical, graphical, and/or acoustical indications of the output of calculation unit 32. These indications may be produced by, but are not limited to, one or more lights or light-emitting diodes, liquid-crystal display (LCD) panels, cathode-ray tube (CRT) displays, speakers, acoustical indicators (buzzers and the like), and/or attached apparatuses (e.g., oscilloscopes). Two exemplary forms of output unit 34 are depicted in FIGS. 5, 6, 7, 8, 9, 10, 11, and 12 (discussed hereinafter), with FIGS. 5, 7, 9, and 11 demonstrating the use of an alphanumeric LCD panel, and FIGS. 6, 8, 10, and 12 demonstrating the use of a graphical CRT display.

Input unit 35 is coupled to calculation unit 32. Input unit 35 may be independent, or may be integral to calculation unit 32, test set 28, and/or probe 30. Multiple input units 35 may be used, with each input unit 35 performing either all or part of the functions of input unit 35 as a whole. Those skilled in the art will appreciate that the location and/or implementation of input unit 35 is not germane to the present invention. The use of alternative embodiments of input unit 35 does not depart from the spirit of the present invention.

Input unit 35 provides the user with the ability to enter data into calculation unit 32. In one form, input unit may include mode selection switch(es) and a keypad by which the user may select the mode of operation and/or enter pertinent data.

Throughout this discussion the terms "propagation velocity" and "propagation rate" are used to represent the "distance/time" and "time/distance" determinations of propagation, respectively.

Test signal 36 propagates through or along conductor 24 from location $P_T$ at a finite and substantially constant propagation velocity $V_C$. Propagation velocity $V_C$ is peculiar to conductor 24, and is generally indeterminate, although certain "standardized" conductors (e.g., RG-6/U coaxial cable) have known and predictable propagation velocities $V_C$.

The propagation velocity $V_C$ of conductor 24 is in all cases less than the velocity of light in a vacuum, c, and usually not less than one-half the that value. That is: $0.5c \leq V_C < C$. It is often more convenient to consider not the propagation velocity (distance/time), but the propagation rate (time/distance). A propagation rate $R_C$ of conductor 24 is in all cases greater than the propagation rate of light in a vacuum, $c^{-1}$, and usually not greater than double that value. That is: $2c^{-1} \geq R_C > c^{-1}$.

Figure 2:
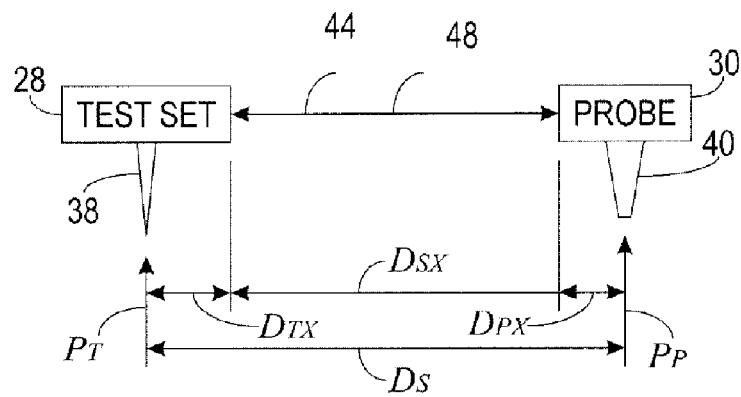
FIG. 2 shows a schematic view of a test set-probe communication link of the system of FIG. 1 utilizing a reference cable in accordance with a preferred embodiment of the present invention.
Figure 3:
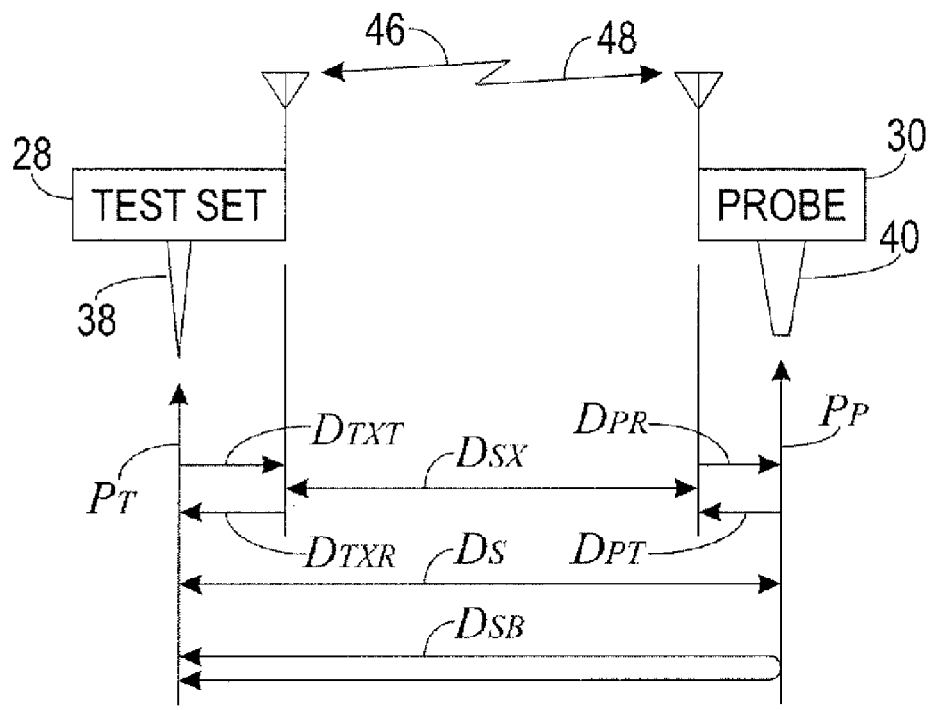
FIG. 3 shows a schematic view of a test set-probe communication link of the system of FIG. 1 utilizing an over-the-air radio link in accordance with a preferred embodiment of the present invention.
Figure 4:
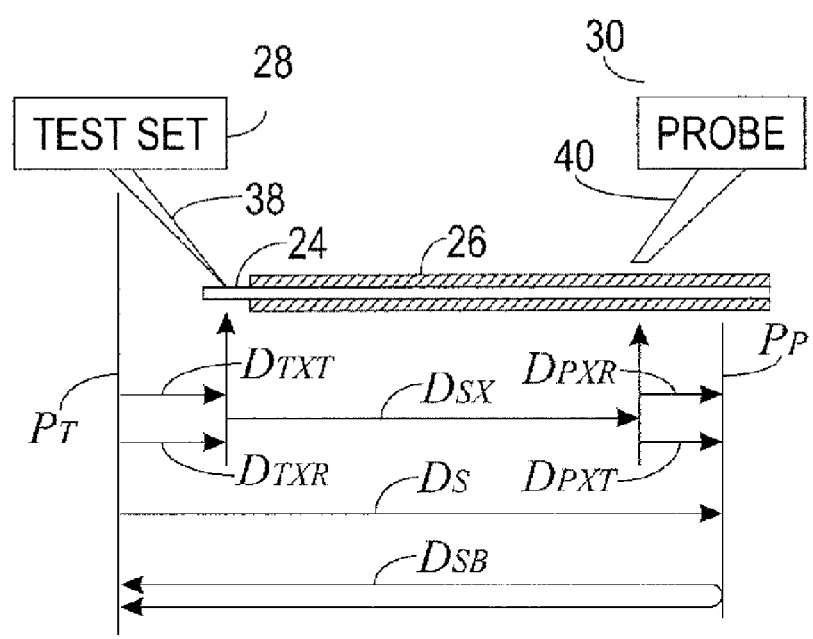
FIG. 4 shows a schematic view of a test set-probe communication link of the system of FIG. 1 utilizing the conductor under test in accordance with a preferred embodiment of the present invention.

FIGS. 2, 3, and 4 show schematic views of a test set-probe communication link 42 of system 20 utilizing a reference cable 44 (FIG. 2), an over-the-air radio-frequency link 46 (FIG. 3), and conductor 24 itself (FIG. 4) in accordance with a preferred embodiment of the present invention. The following discussion refers to FIGS. 1, 2, 3, and 4.

Probe 30 is configured to detect test signal 36 at location $P_P$. For test signal 36 to propagate from location $P_T$ to location $P_P$ requires a given amount of time (assuming location $P_P$ is not substantially coincident with location $P_T$). This time is the electrical distance or propagation delay $D_{TP}$ between locations $P_T$ and $P_P$.

Probe 30 desirably has a minimal effect upon conductor 24. That is, the presence of probe 30 desirably does not create a significant anomaly 22 of conductor 24 (i.e., does not create a significant change in impedance). It is a goal of system 20 to detect the presence of probe 30 so as to determine location $P_P$ and propagation delay $D_{TP}$ between test set 28 and probe 30.

Communication link 42 aids in achieving this goal. Communication link 42 couples test set 28 and probe 30 and makes possible communication between them independent of test signal 36. Communication link 42 has a propagation delay $D_S$ consisting of three parts: propagation delay $D_{TX}$ within test set 28, propagation delay $D_{PX}$ within probe 30, and propagation delay $D_{SX}$ within a medium 48 coupling test set 28 and probe 30. Propagation delays $D_{TX}$, $D_{PX}$, and $D_{SX}$ are processed in calculation unit 32 to calculate propagation delay $D_S$ of communication link 42.

In one exemplary methodology, test set 28 injects test signal 36 into conductor 24 at location $P_T$. Probe 30 detects test signal 36 at location $P_P$ after propagation delay $D_{TP}$. The detection information may then be routed from probe 30 back to test set 28 over communication link 42. This adds propagation delay $D_S$ to propagation delay $D_{TP}$. Calculation unit 32 may then subtract propagation delay $D_S$ from combined propagation delays $(D_{TP}+D_S)$ to determine propagation delay $D_{TP}$. This simple and straightforward approach allows propagation delay $D_{TP}$ of conductor 24 between locations $P_T$ and $P_P$ to be determined as long as propagation delay $D_S$ of communication link 42 is known.

In another exemplary methodology, probe 30 may can also assign a time stamp to the instant when test signal 36 is detected. If propagation delay $D_S$ is known, by knowing the instant test signal 36 was injected (from test set 28) and the instant test signal 36 was detected (from probe 30, either directly or through test set 28) calculation unit 32 may calculate propagation delay $D_{TP}$.

Propagation delays $D_{TX}$ and $D_{PX}$ may be determined during the manufacture and testing of system 20. Once determined, propagation delays $D_{TX}$ and $D_{PX}$ remain substantially constant. Therefore, propagation delay $D_{SX}$ of medium 48 is the only "variable" component of propagation delay $D_S$.

Medium 48 couples test set 28 and probe 30, may assume any of at least three forms: a dedicated reference cable 44 (FIG. 2), an over-the-air radio-frequency link 46 (hereinafter RF link 46), and conductor 24 itself. Those skilled in the art will appreciate that other forms of medium 48 not discussed herein may be used without departing from the spirit of the present invention.

Medium 48 may be reference cable 44. Reference cable 44 (or each of several reference cables 44 of differing lengths or other characteristics) may have a predetermined propagation delay $D_{SX}$. For example, RG-6/U coaxial cable has a propagation velocity of nominally 82 percent of the velocity of light in a vacuum, c, or approximately 245.8298 Mm·s$^{-1}$. Therefore, if reference cable 44 were a 15-meter length of RG-6/U coaxial cable, propagation delay $D_{SX}$ would be approximately 61.0185 ns.

If propagation delays $D_{TX}$, $D_{PX}$, and $D_{SX}$ of test set 28, probe 30, and reference cable 44, respectively, are all predetermined, hence known, then propagation delay $D_S$ of communication link 42, being substantially the sum of propagation delays $D_{TX}$, $D_{PX}$, and $D_{SX}$, is also known. Propagation delay $D_{TP}$ may then be calculated by calculation unit 32 as discussed hereinbefore.

The use of reference cable 44 allows system 20 to determine propagation delay $D_S$ of communication link 42 even if any of propagation delays $D_{TX}$, $D_{PX}$, and $D_{SX}$ is unknown. Just as propagation delay $D_{TP}$ may be determined as long as propagation delay $D_S$ is known, so may propagation delay $D_S$ be determined as long as propagation $D_{TP}$ is known.

The easiest way to make propagation delay $D_{TP}$ known is to set the difference between location $P_T$ and location $P_P$ to substantially zero. This may be achieved by placing probe 30 at the same location on conductor as test set 28 (i.e., location $P_P$ equals location $P_T$). Again test set 28 injects test signal 36 into conductor 24 at location $P_T$. Probe 30 detects test signal 36 at location $P_P$. Since location $P_P$ is substantially the same as location $P_T$, propagation delay $D_{TP}$ is substantially zero. The detection information is then routed from probe 30 back to test set 28 over communication link 42. This adds propagation delay $D_S$ to propagation delay $D_{TP}$ (zero). Propagation delay $D_S$ is therefore the overall propagation delay. This simple and straightforward approach allows propagation delay $D_S$ of communication link 42 to be calculated by calculation unit 32.

Those skilled in the art will appreciate that the methodologies described herein for the determination of propagation delay $D_S$ with the use of reference cable 44 are not the only possible methodologies. The use of an alternative methodology does not depart from the spirit of the present invention.

Medium 48 may be RF link 46. By its very nature, propagation delay $D_{SX}$ of RF link 46 must be determined dynamically. By establishing RF link 46 as a bidirectional link, a bidirectional propagation delay $D_{SB}$ may readily be determined as the time it takes test set 28 to transmit a signal to probe over RF link 46, have probe 30 echo the signal back to test set 28, and have test set 28 receive the signal.

In this case, test set 28 has two predetermined (i.e., known) propagation delays, transmission propagation delay $D_{TXT}$ (i.e., the time it takes test set 28 to transmit the signal) and reception propagation delay $D_{TXR}$ (i.e., the time it takes test set 28 to receive the signal), which may not be identical. Similarly, probe 30 also has two predetermined (i.e., known) propagation delays, reception propagation delay $D_{PXR}$ (i.e., the time it takes probe 30 to receive the signal) and transmission propagation delay $D_{PXT}$ (i.e., the time it takes test set 28 to receive the signal), which may not be identical.

Bidirectional propagation delay $D_{SB}$ is the sum of propagation delays (in order from initial transmission to final reception) $D_{TXT}$, $D_{SX}$, $D_{PXR}$, $D_{PXT}$, $D_{SX}$, and $D_{TXR}$. Since propagation delays $D_{TXT}$, $D_{PXR}$, $D_{PXT}$, and $D_{TXR}$ are predetermined, they may be subtracted out, leaving $2 \times D_{SX}$, where $D_{SX}$ is the propagation delay of RF link 46, as the remainder. Propagation delay $D_S$ may then be calculated by adding propagation delays $D_{TXT}$, $D_{SX}$, and $D_{PXR}$.

Those skilled in the art will appreciate that the methodology described herein for the determination of propagation delay $D_S$ with the use of RF link 46 is not the only possible methodology. The use of an alternative methodology does not depart from the spirit of the present invention.

Medium 48 may be conductor 24 itself. Test set 28 may transmit a second signal (not shown), independent of test signal 36, into or onto conductor 24. This second signal is received and retransmitted by probe 30, then received by test set 28. A bidirectional propagation delay $D_{SB}$ may readily be determined as the time from initial transmission to final reception by test set 28.

As with RF link 46, test set 28 has transmission propagation delay $D_{TXT}$ and reception propagation delay $D_{TXR}$, which may not be identical. Similarly, probe 30 has reception propagation delay $D_{PXR}$ and transmission propagation delay $D_{PXT}$, which may not be identical.

Bidirectional propagation delay $D_{SB}$ is the sum of propagation delays (in order from initial transmission to final reception) $D_{TXT}$, $D_{TP}$, $D_{PXR}$, $D_{PXT}$, $D_{TP}$, and $D_{TXR}$. If propagation delays $D_{TXT}$, $D_{PXR}$, $D_{PXT}$, and $D_{TXR}$ are subtracted from propagation delay DRF, the difference is $2 \cdot D_{TP}$, where $D_{TP}$ is the propagation delay of conductor 24 from location $P_T$ to location $P_P$. Propagation delay $D_S$ may be calculated by adding propagation delays $D_{TXT}$, $D_{TP}$, and $D_{PXR}$.

Those skilled in the art will appreciate that the methodology described herein for the determination of propagation delay $D_S$ with the use of conductor 24 is not the only possible methodology. The use of an alternative methodology does not depart from the spirit of the present invention.

FIGS. 5, 6, 7, 8, 9, 10, 11, and 12 show exemplary versions of output unit 34. FIGS. 5, 7, 9, and 11 show an exemplary alphanumeric output unit 34', and FIGS. 6, 8, 10, and 12 show an exemplary graphical output unit 34" in accordance with preferred embodiments of the present invention.

FIGS. 5 and 6 show output units 34' and 34", respectively, displaying/indicating locations $P_T$, $P_P$, and $P_A$ during general testing of conductor 24. FIGS. 7 and 8 show output units 34' and 34", respectively, displaying/indicating locations $P_T$, $P_P$, and $P_A$ when location $P_P$ is substantially coincident with location $P_A$. The following discussion refers to FIGS. 1, 5, 6, 7, and 8.

Using conventional reflectometric methodology, test set 28 injects test signal 36 into or onto conductor 24. Test signal 36 propagates through or along conductor 24. As test signal 36 encounters anomaly 22 at location $P_A$, at least a portion of test signal 36 is reflected. This reflection propagates back to test set 28, where it is detected. Calculation unit 32 then calculates, and output unit 34 indicates, propagation delay $D_{TA}$ between test set 28 and anomaly 22. Once propagation delays $D_{TP}$ and $D_{TA}$ have been calculated, calculation unit 32 can calculate propagation delay $D_{PA}$, i.e., the propagation delay between probe 30 and anomaly 22.

Alternatively, the properties of test signal 36 itself may allow an estimate of propagation delay $D_{PA}$. Since both the forward-traveling (direct) and reverse-traveling (reflected) components of test signal 36 are present at location $P_P$ of probe 30, calculation unit 32 may calculate propagation delay $D_{PA}$ between probe 30 and anomaly 22.

Alphanumeric output unit 34' (FIG. 5) indicates propagation delays $D_{TP}$, $D_{TA}$, and $D_{PA}$ as displayed numeric values. Graphic output unit 34" (FIG. 6) displays locations $P_T$, $P_P$, and $P_A$ as pips in a linear-scan format, with propagation delays $D_{TP}$ and $D_{TA}$ being displayed numerically and as the distances between the $P_T$ and $P_P$ pips and the $P_T$ and $P_A$ pips, respectively, with propagation display $D_{PA}$ being the distance between the $P_P$ and $P_A$ pips.

Those skilled in the art will appreciate that a linear-scan graphic display, such as graphic output unit 34", may have a time scale. This time scale may or may not be visible, and may be different for displays affixed to test set 28 or probe 30, due to the way in which test set 28 and probe 30 perceive test signal 36 and its reflections. Also the positions of time signal 36 and its reflections may be displayed as pips, triangles, diamonds, and/or any other indicator and/or mix of indicators. The use of alternative time scales and/or indicators does not depart from the spirit of the present invention.

Once location $P_A$ of anomaly 22 relative to location $P_P$ of probe 30 is known, it is possible to trace conductor 24, using probe 30 as a "sniffer," until probe 30 is over anomaly 22, i.e., until location $P_P$ is substantially coincident with location $P_A$ and propagation delay $D_{PA}$ is substantially zero. In this manner, location $P_A$ may be identified, i.e., the physical location of anomaly 22 may be determined.

Alphanumeric output unit 34' (FIGS. 5 and 7) depict propagation delays $D_{TP}$ shifting from an exemplary value of 8.136 ns to the value of propagation delay $D_{PA}$, while simultaneously propagation delay $D_{PA}$ shifts from an exemplary value of 78.103 ns to zero. Graphic output unit 34" (FIGS. 6 and 8) displays the pip for location $P_P$ moving from its original location to become coincident with the pip for location $P_A$.

FIGS. 9 and 10 show alphanumeric and graphical output units 34' and 34", respectively, displaying/indicating location $P_T$ and physical distances $L_{TP}$, $L_{TA}$, and $L_{PA}$ when physical distance $L_{TP}$ is known in accordance with a preferred embodiment of the present invention. The following discussion refers to FIGS. 1, 9, and 10.

Often, it is possible to establish a substantially exact physical distance (length) $L_{TP}$ between locations $P_T$ and $P_P$, i.e., between test set 28 and probe 30. This establishes a physical distance $L_{TP}$ for propagation delay $D_{TP}$. Physical distance $L_{TP}$ may then be entered into calculation unit 32 via input unit 35. Once calculation unit 32 has both propagation delay $D_{TP}$ and physical distance $L_{TP}$, calculation unit 32 may readily calculate propagation rate $R_C$ of conductor 24. Once propagation rate $R_C$ is known, then physical distance $L_{TA}$ between test set 28 and anomaly 22 and physical distance $L_{PA}$ between probe 30 and anomaly 22 may be calculated.

Alphanumeric output unit 34' (FIG. 9) depicts propagation delay $D_{TP}$ and physical distances $L_{TP}$, $L_{TA}$, and $L_{PA}$ as numerical values. Graphic output unit 34" (FIG. 10) displays the entered physical distance $L_{TP}$, as well as the propagation delays $D_{TP}$ and DTA and the calculated physical distances $L_{TA}$ and $L_{PA}$ of the pips for locations $P_P$ and $P_A$.

FIGS. 11 and 12 show alphanumeric and graphical output units 34' and 34", respectively, displaying location $P_T$, propagation rate $R_C$, and physical distances $L_{TA}$ and $L_{PA}$ when propagation rate $R_C$ is known in accordance with a preferred embodiment of the present invention. The following discussion refers to FIGS. 1, 11, and 12.

When either propagation velocity $V_C$ or propagation rate $R_C$ of conductor 24 is known (e.g., conductor 24 is an RG-6/U coaxial cable where $R_C = 4.0668$ ns·m$^{-1}$), then by entering propagation velocity $V_C$ or propagation rate $R_C$ into calculation unit 32 via input unit 35, calculation unit 32 may readily calculate physical distance $L_{TA}$ between test set 28 and anomaly 22 and physical distance $L_{PA}$ between probe 30 and anomaly 22.

Alphanumeric output unit 34' (FIG. 11) depicts propagation delay $D_{TP}$, propagation rate $R_C$, and physical distances $L_{TA}$, and $L_{PA}$ as numerical values. Graphic output unit 34" (FIG. 12) displays the entered propagation rate $R_C$, as well as the propagation delays $D_{TP}$ and $D_{TA}$ and the calculated physical distances $L_{TA}$ and $L_{PA}$ of the pips for locations $P_P$ and $P_A$.

In summary, the present invention teaches a system 20 and method to locate an anomaly 22 of a conductor 24. System 20 determines, for conductor 24, physical distance $L_{TP}$ from an injection location $P_T$ to a detection location $P_P$, a physical distance $L_{PA}$ from injection location $P_T$ to an anomaly location $P_A$, a propagation delay $D_{PT}$ between injection location $P_T$ and anomaly location $P_A$, and a propagation velocity $V_C$ and/or propagation rate $R_C$.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A system (20) to locate an anomaly (22) of a conductor (24), said system (20) comprising:
   a test set (28) coupled to said conductor (24) at a location PT along said conductor (24) and configured to inject a test signal (36) into said conductor (24) at said location PT;
   a probe (30) coupled to said conductor (24) at a location PP along said conductor (24) and configured to detect said test signal (36) at said location PP;
   a communication link (42) configured to couple said probe (30) to said test set (28), said communication link having a propagation delay DS; and
   a calculation unit (32) coupled to one of said probe (30) and said test set (28) and configured to calculate a propagation delay DTP of said conductor (24) between said location PT and said location PP in response to said propagation delay DS.

2. A system (20) as claimed in claim 1 wherein said probe (30) is electrically coupled to said conductor (24) at said location PP without physical contact.

3. A system (20) as claimed in claim 1 wherein said propagation delay DS comprises:
   a propagation delay DTX within said test set (28);
   a propagation delay DPX within said probe (30); and
   a propagation delay DSX of a medium (48) coupling said probe (30) to said test set (28).

4. A system (20) as claimed in claim 3 wherein said medium (48) is one of:
   said conductor (24);
   a reference cable (44); and
   an over-the-air radio-frequency link (46).

5. A system (20) as claimed in claim 3 wherein said calculation unit (32) is configured to calculate said propagation delay $D_S$ in response to said propagation delay $D_{TX}$, said propagation delay $D_{PX}$, and said propagation delay $D_{SX}$.

6. A system (20) as claimed in claim 1 additionally comprising an output unit (34) coupled to said calculation unit (32) and configured to indicate said location $P_P$ relative to said location $P_T$ and a location $P_A$ of said anomaly (22).

7. A system (20) as claimed in claim 1 wherein said calculation unit (32) is configured to calculate a propagation delay $D_{TA}$ of said conductor (24) from said location $P_T$ to a location $P_A$ of said anomaly (22).

8. A system (20) as claimed in claim 7 wherein said calculation unit (32) is configured to calculate a propagation delay $D_{PA}$ in response to said propagation delay $D_{TA}$ and said propagation delay $D_{TP}$.

9. A system (20) as claimed in claim 7 wherein said location $P_A$ is identified by adjusting said location $P_P$ until said calculation unit (32) calculates said propagation delay $D_{PA}$ to be substantially zero.

10. A system (20) as claimed in claim 1 wherein said calculation unit (32) is configured to calculate said propagation delay $D_S$ when a difference between said location $P_T$ and said location $P_P$ is substantially zero.

11. A system (20) as claimed in claim 1 wherein:
   said test signal (36) is a reflectometric test signal; and
   said test signal (36) is one of:
   a pulse;
   a digital sequence;
   a spread-spectrum signal; and
   a sequence of one or more sine waves.

12. A system (20) as claimed in claim 1 wherein:
   said probe (3) is one of a plurality of said probes (30);
   said location $P_P$ is one of a plurality of said locations PP;
   said propagation delay DTP is one of a plurality of said propagation delays DTP;
   each of said probes (30) is coupled to said conductor (24) at a unique one of said locations PP; and
   said calculation unit (32) is configured to calculate a unique one of said propagation delays DTP of said conductor between said location PT and each of said locations PP in response to said propagation delay DS.

13. A method to locate an anomaly (22) of a conductor (24), said method comprising:
   establishing a communication link (42) between a probe (30) and a test set (28);
   determining a propagation delay DS of said communication link (42);
   injecting a test signal (36) at a location PT along said conductor (24) using said test set (28);
   detecting said test signal (36) at a location PP along said conductor (24) using said probe (30); and
   calculating a propagation delay DTP between said location PT and said location PP in response to said propagation delay DS.

14. A method as claimed in claim 13 additionally comprising electrically coupling said probe (30) to said conductor (24) without physical contact.

15. A method as claimed in claim 13 additionally comprising:
   ascertaining a physical distance LTP along said conductor (24) between said location PT and said location PP; and
   calculating a propagation velocity VC of said conductor (24) in response to said physical distance LTP and said propagation delay DTP.

16. A method as claimed in claim 13 additionally comprising:
   ascertaining a propagation velocity VC of said conductor (24); and
   calculating, in response to said propagation velocity VC, one of:
   a physical distance LTP along said conductor (24) between said location PT and said location PP;
   a physical distance LTA along said conductor (24) between said location PT and said location PA; and
   a physical distance LPA along said conductor (24) between said location PP and a location PA of said anomaly (22).

17. A method as claimed in claim 13 additionally comprising:
   calculating a propagation delay $D_{PA}$ of said conductor (24) from said location PT to a location PA of said anomaly (22); and
   calculating a propagation delay DPA of said conductor (24) from said location PT to said location PA in response to said propagation delay $D_{PA}$ and said propagation delay DTP.

18. A method as claimed in claim 17 additionally comprising identifying said location $P_A$ by adjusting said location $P_P$ until said propagation delay $D_{PA}$ is substantially zero.

19. A method as claimed in claim 13 wherein said detecting activity comprises adjusting an attitude of said probe (30) proximate said conductor (24) until said detected test signal (36) achieves a maximum amplitude.

20. A system (20) to locate an anomaly (22) of a conductor (24), said system (20) comprising:
- a test set (28) coupled to said conductor (24) at a location PT along said conductor (24) and configured to inject a test signal (36) into said conductor (24) at said location PT, wherein said test signal (36) is one of:
- a time-domain reflectometry pulse;
- a digital sequence;
- a spread-spectrum signal; and
- a sequence of one or more sine waves;
- a probe (30) coupled to said conductor (24) at a location PP and configured to detect said test signal (36) at said location PP; and
- a calculation unit (32) coupled to one of said test set (28) and said probe (30) and configured to calculate a propagation delay DPA of said conductor (24) from said location PP to a location PA of said anomaly (22).

21. A system (20) as claimed in claim 20 wherein said location $P_A$ is identified by adjusting said location $P_P$ until said calculation unit (32) calculates said propagation delay $D_{PA}$ to be substantially zero.

22. A system (20) as claimed in claim 20 wherein one of said test set (28) and said probe (30) is electrically coupled to said conductor (24) by one of:
- inductive coupling;
- capacitive coupling; and
- radiative coupling.

23. A system (20) as claimed in claim 20 wherein said probe (30) is adjusted at said location $P_P$ to an attitude where said detected test signal (36) achieves a maximum amplitude.

24. A system (20) as claimed in claim 20 additionally comprising an indication unit (34) coupled to said calculation unit (32) and configured to indicate one of:
- an amplitude of said test signal (36) detected by said probe (30);
- said location PP relative to said location PT; and
- said location PP of said probe (30) relative to said location $P_A$.

* * * * *